United States Patent [19]

Brown

[11] Patent Number: 4,737,828

[45] Date of Patent: Apr. 12, 1988

[54] METHOD FOR GATE ELECTRODE FABRICATION AND SYMMETRICAL AND NON-SYMMETRICAL SELF-ALIGNED INLAY TRANSISTORS MADE THEREFROM

[75] Inventor: Dale M. Brown, Schenectady, N.Y.

[73] Assignee: General Electric Company, Schenectady, N.Y.

[21] Appl. No.: 840,635

[22] Filed: Mar. 17, 1986

[51] Int. Cl.$^4$ .................... H01L 29/78; H01L 21/00; H01L 21/306; B44C 1/22; C23F 1/02

[52] U.S. Cl. .................... 357/23.1; 156/643; 156/653; 156/656; 156/657; 156/662; 357/23.11; 357/41; 357/55; 437/41; 437/61; 437/228

[58] Field of Search ............... 29/571, 576 B, 576 W, 29/580; 148/187; 357/23.1, 41, 65, 23.11, 55, 91; 156/643, 644, 646, 653, 656, 657, 659.1, 662; 204/192 EC, 192 E, 192 B; 427/88; 437/40, 41, 61, 228, 238, 241

[56] References Cited

U.S. PATENT DOCUMENTS

| | | | |
|---|---|---|---|
| 3,899,372 | 8/1975 | Esch et al. | 156/657 X |
| 4,214,917 | 7/1980 | Clark et al. | 156/657 X |
| 4,529,686 | 7/1985 | Kraus | 430/314 |
| 4,536,782 | 8/1985 | Brown | 357/23.1 |
| 4,542,577 | 9/1985 | Jackson | 156/651 X |
| 4,572,765 | 2/1986 | Berry | 156/653 X |
| 4,590,093 | 5/1986 | Woerlee et al. | 427/79 |
| 4,597,824 | 7/1986 | Shinada et al. | 156/643 |
| 4,597,827 | 7/1986 | Nishitani et al. | 156/643 |

OTHER PUBLICATIONS

Chow, T. Paul, "Advanced Devices Structures Fabricated with Anisotropic Dry Etching", *VLSI Electronics: Microstructure Science*, vol. 8, 1984, pp. 487–508.

Woerlee, P. H. et al., "Novel Method of Producing Ultrasmall Platinum Silicide Gate Electrodes", *Applied Physics Letters*, 47(7), Oct. 1985, pp. 700–702.

Busta, H. H. et al., "Formation of Ultrathin Tungsten Filaments via Selective Low-Pressure Chemical Vapor Deposition", *Journal of Applied Physics*, 58(2), Jul. 1985, pp. 987–989.

*Primary Examiner*—William A. Powell
*Attorney, Agent, or Firm*—Lawrence D. Cutter; James C. Davis, Jr.; Marvin Snyder

[57] ABSTRACT

An edge defining method is employed in the fabrication of narrow electrical patterns for VLSI circuits. The method is particularly employable in the formation of inlay MOSFET transistors having extremely narrow gate widths. The method is also particularly amenable to the fabrication of both symmetrical and non-symmetrical MOSFET devices on the same VLSI circuit chip. The inlay transistor structure is also employed to fabricate NOR and NAND type "ladder" networks and to join vertically and horizontally adjacent semiconductor devices.

28 Claims, 28 Drawing Sheets

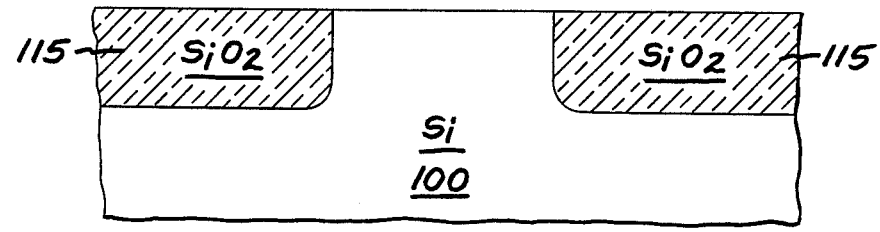
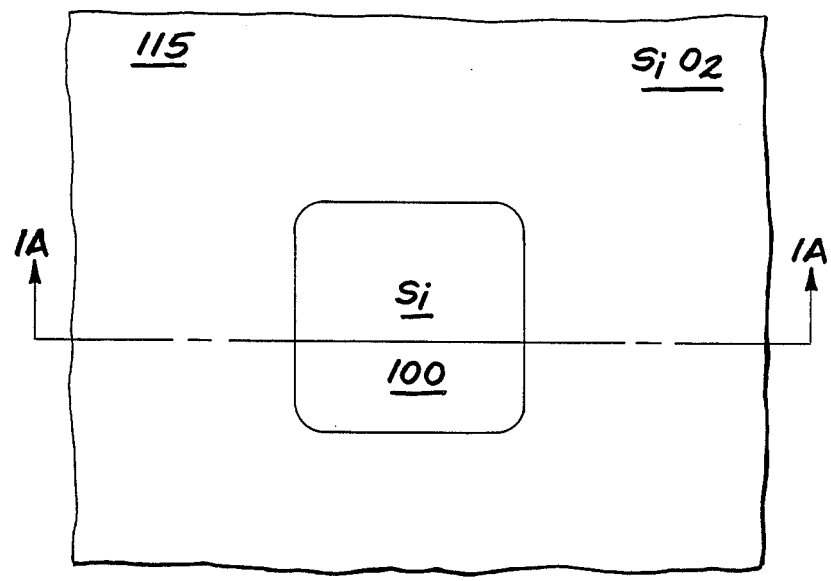

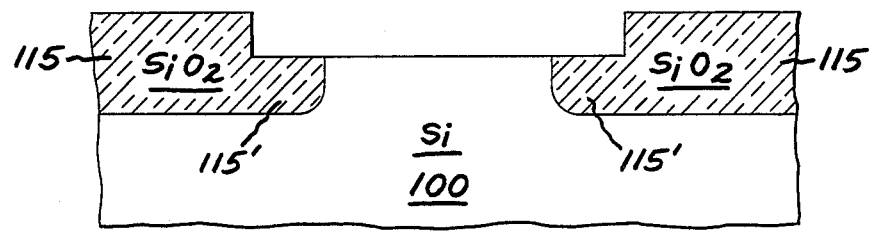
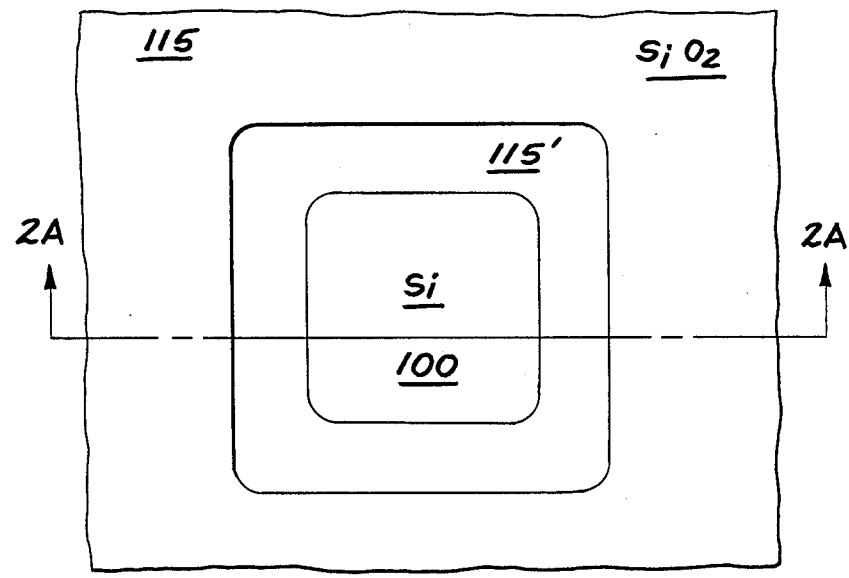

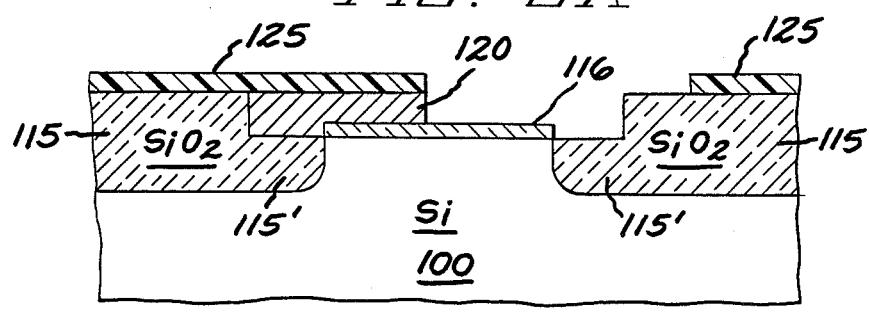
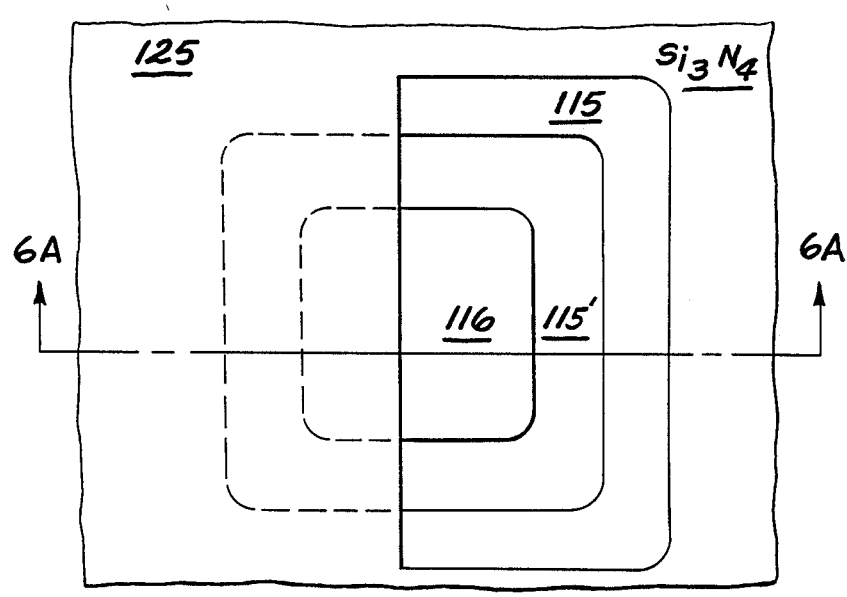

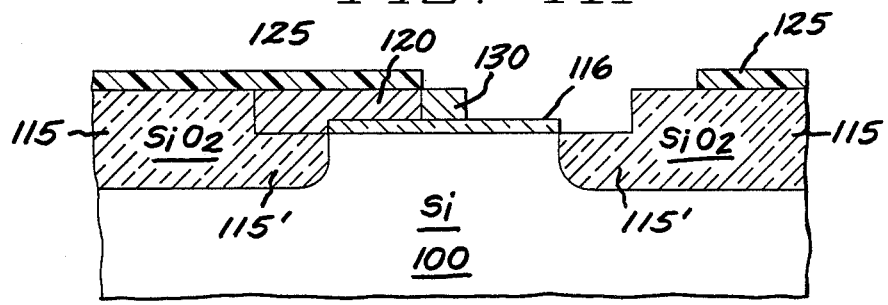
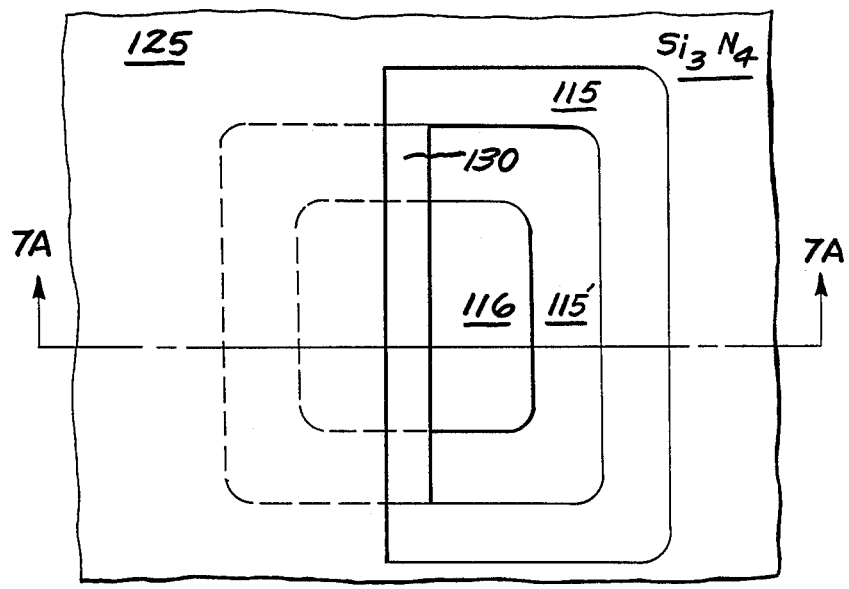

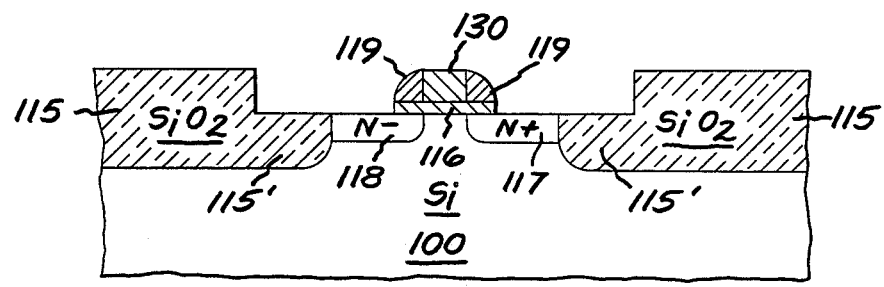
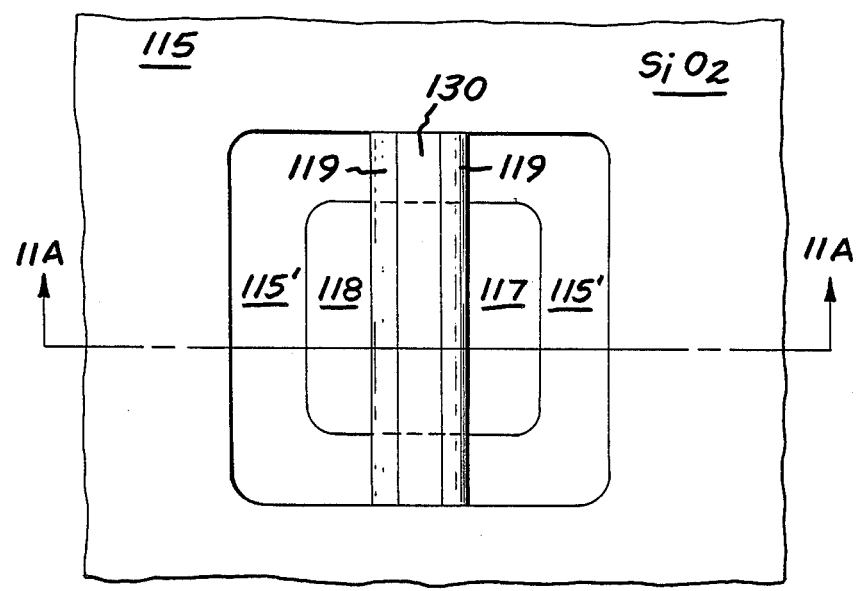

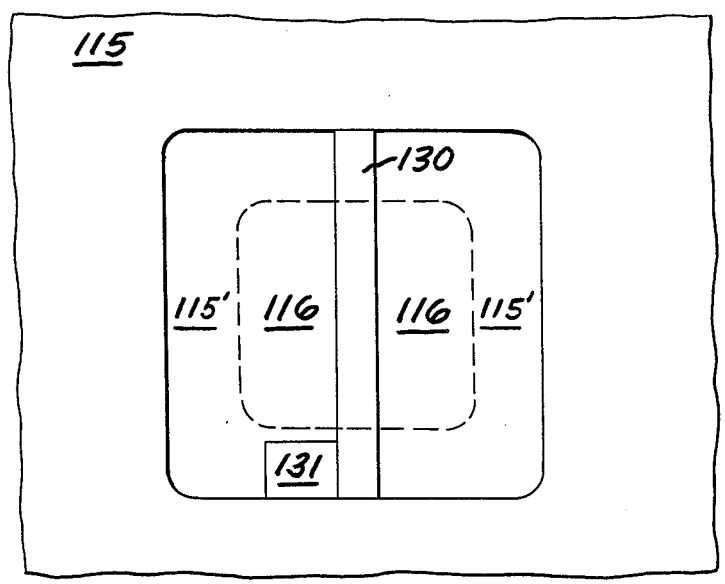

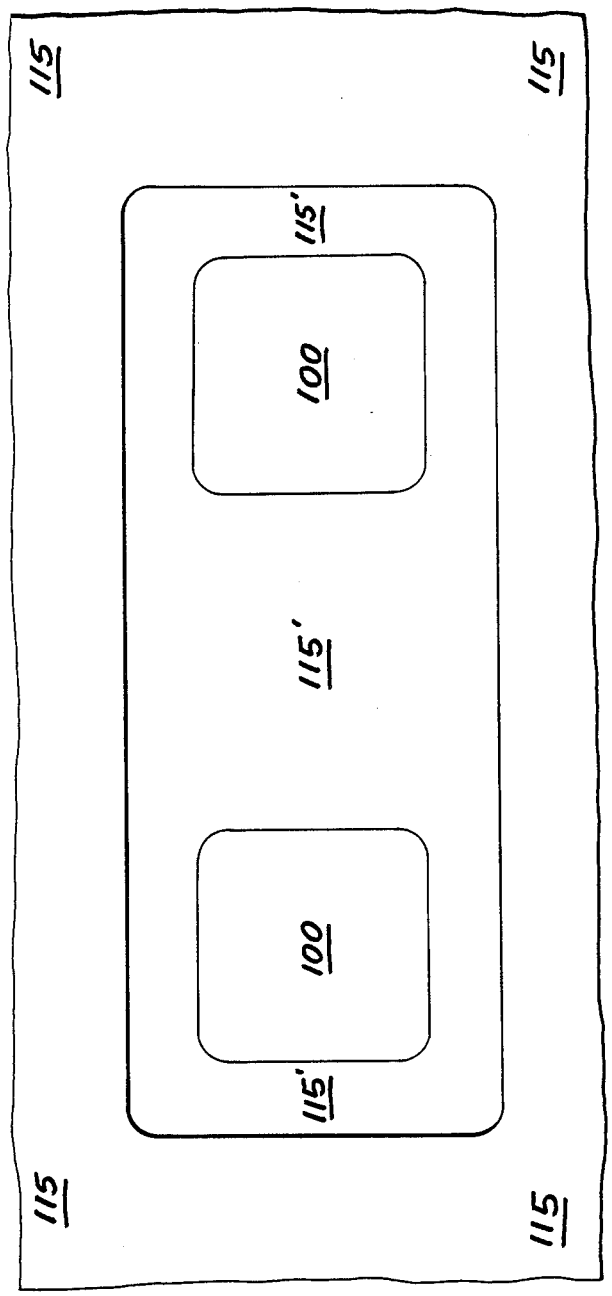

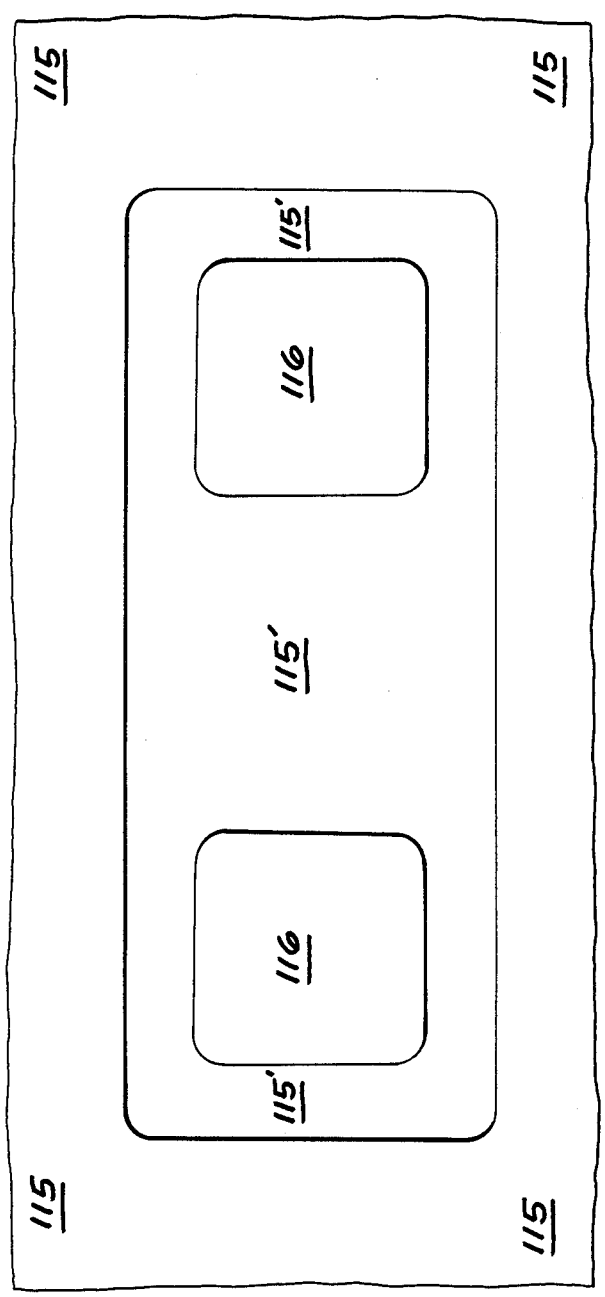

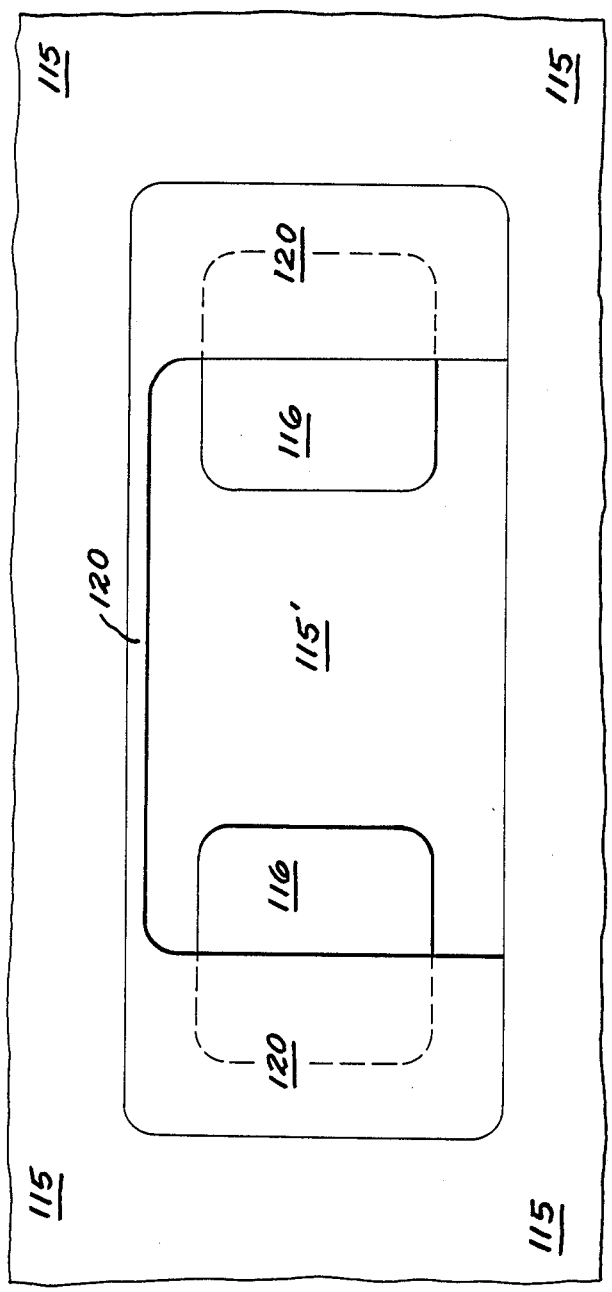

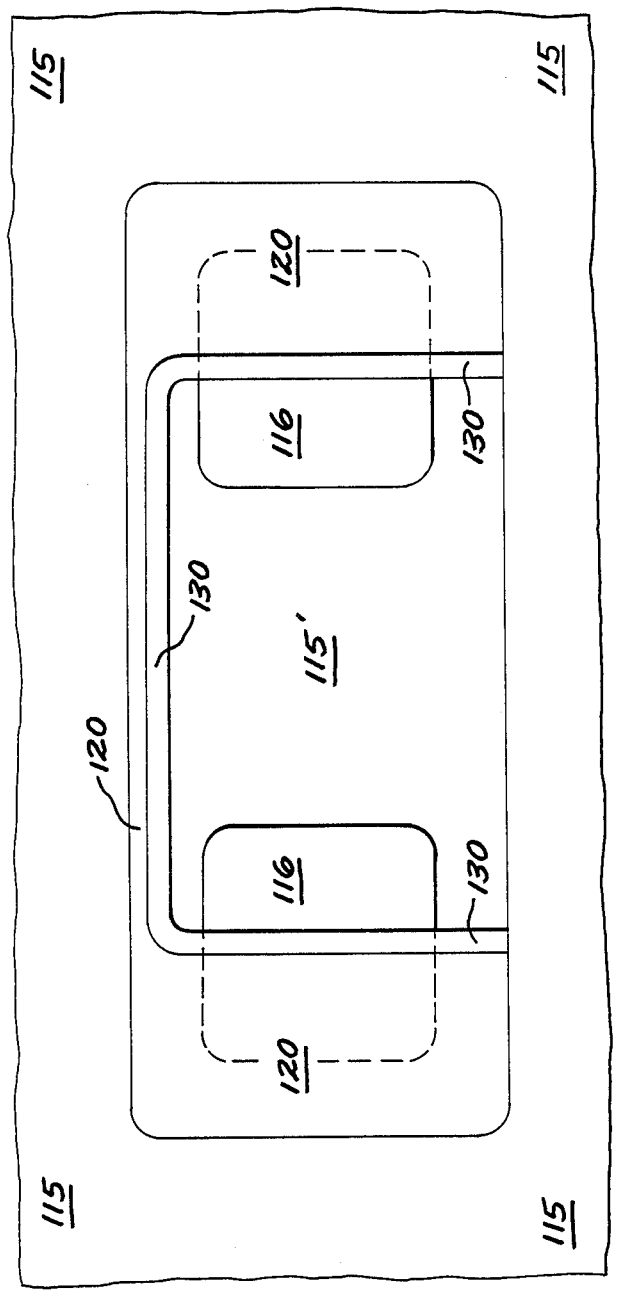

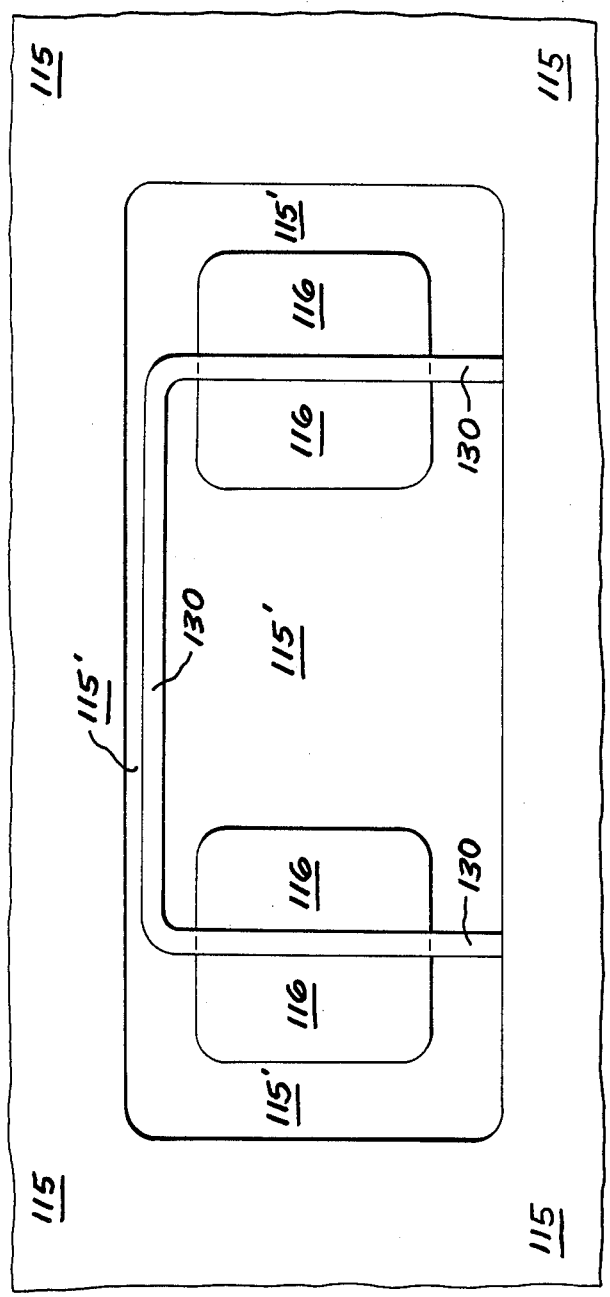

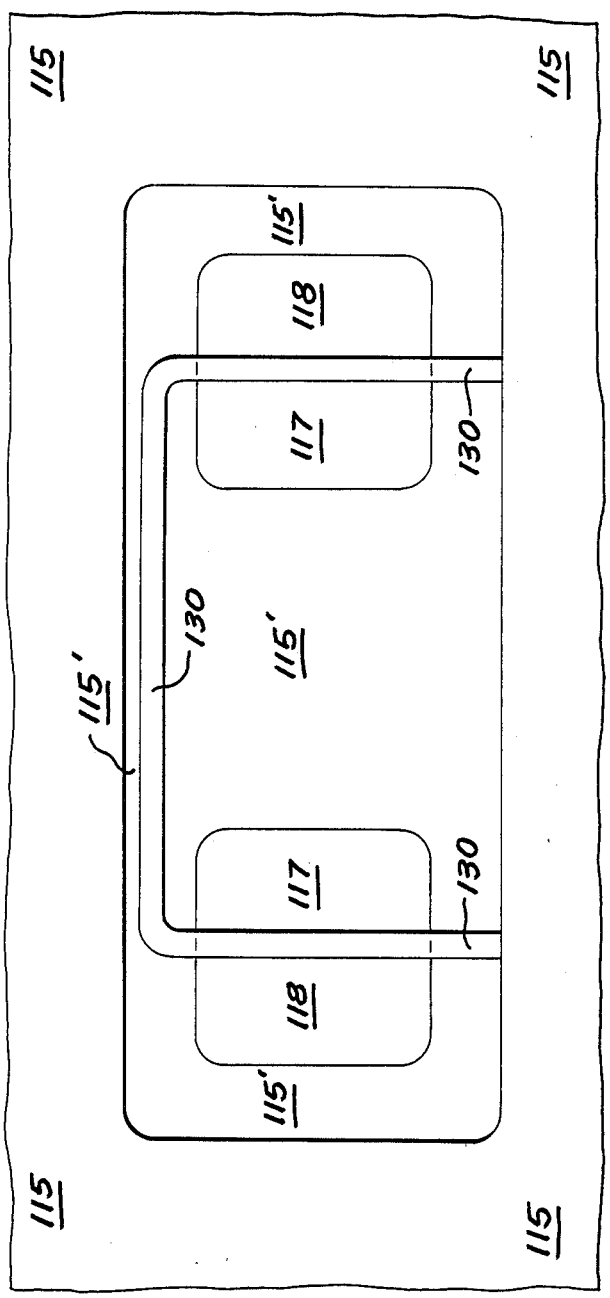

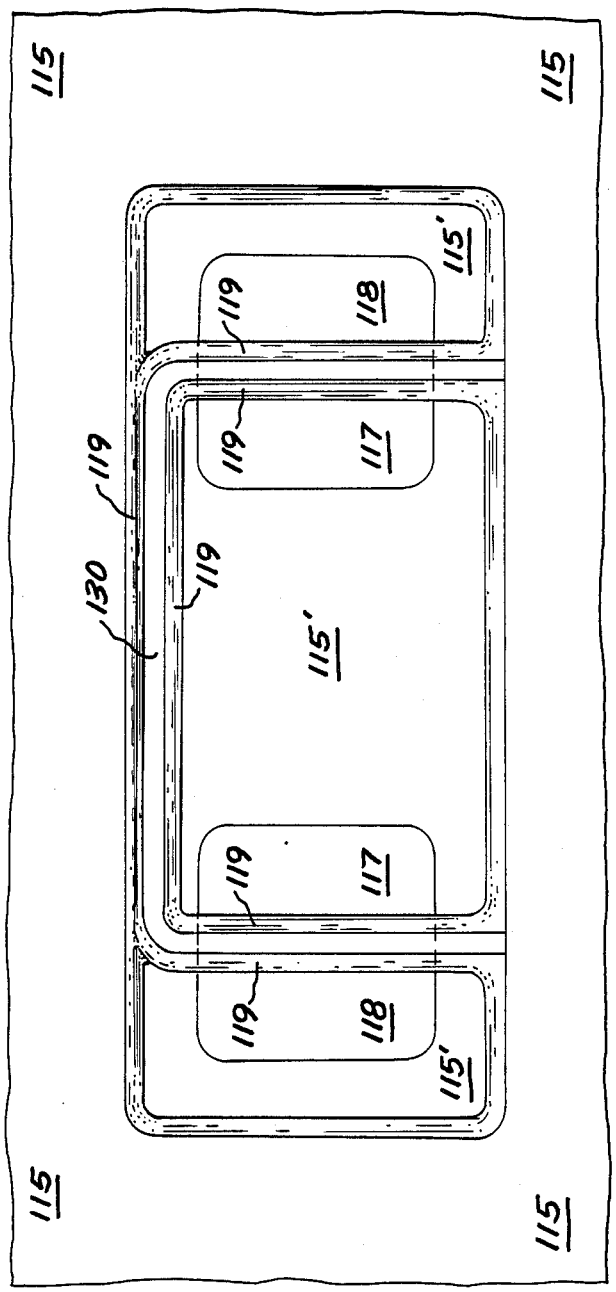

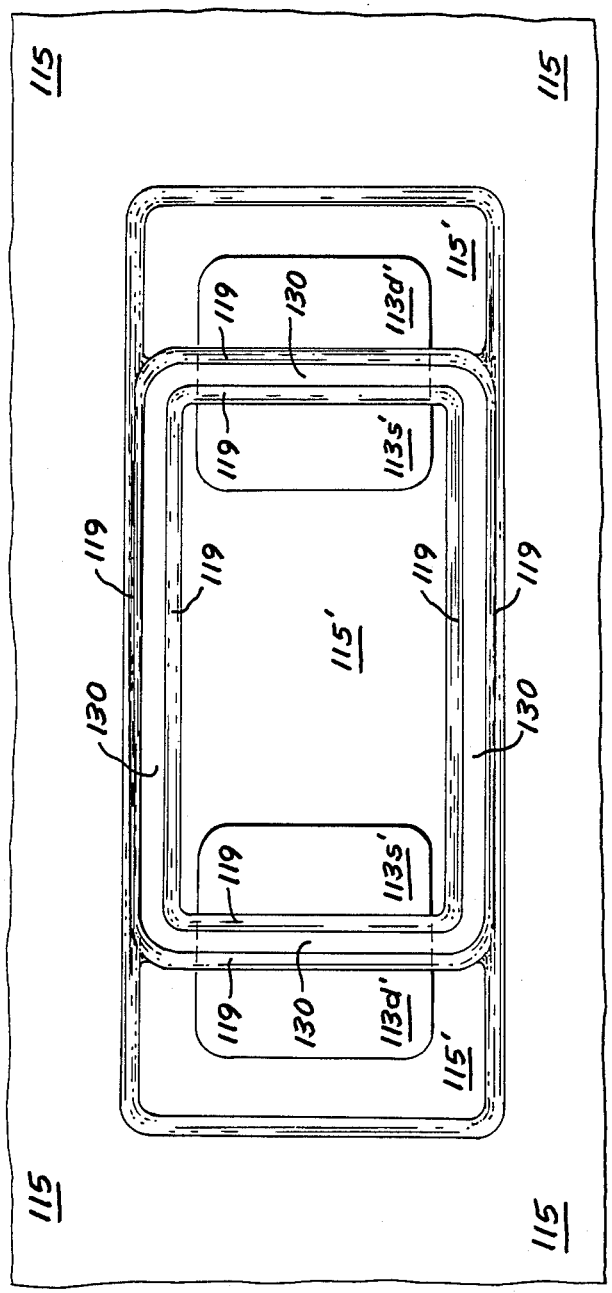

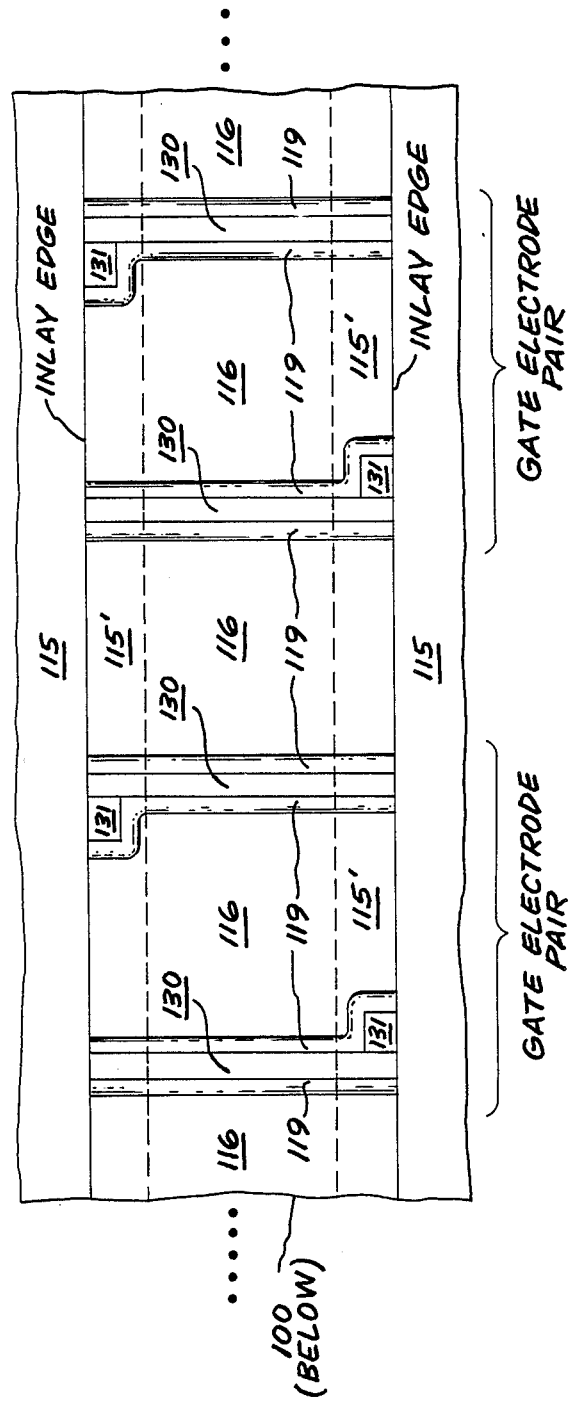

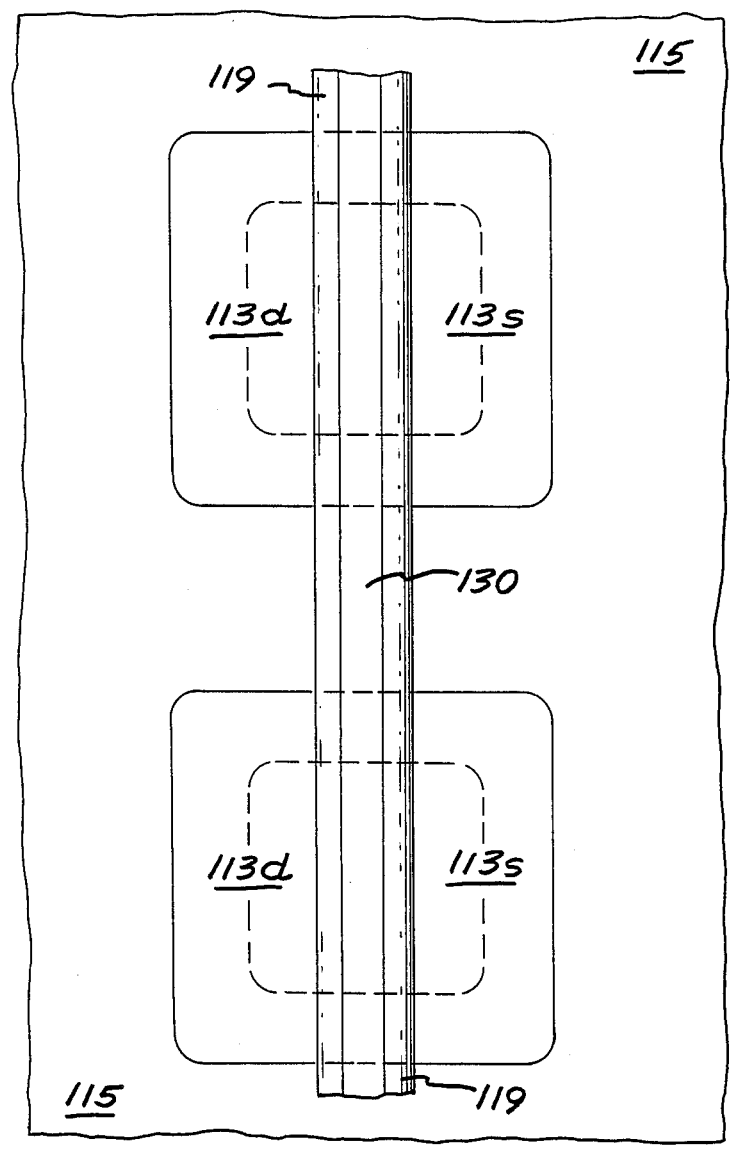

METHOD FOR GATE ELECTRODE FABRICATION AND SYMMETRICAL AND NON-SYMMETRICAL SELF-ALIGNED INLAY TRANSISTORS MADE THEREFROM

BACKGROUND OF THE INVENTION

The present invention is generally directed to a method for the formation of gate electrodes in VLSI transistor devices, particularly metal oxide semiconductor (MOS) devices. More particularly, the present invention is directed to the construction of symmetrical and non-symmetrical submicron gate, self-aligned inlay transistors. Even more particularly, the present invention is directed to an edge defined method for formation of gate electrodes and other narrow width, conductive electrical circuit patterns on integrated circuit chips. The present invention is also directed to an inlay MOS transistor structure.

In the fabrication of integrated circuit chips, one of the major design goals of electrical circuit technology over the last two decades has been the reduction in size of electrical circuit components, particularly components employed in digital circuit devices including memories, processor chips, and the like. One of the requirements for such miniature devices is the fabrication of electrical circuit conductive patterns of extremely narrow width. As device size has shrunk, engineers and physicists involved in device fabrication have found limitations in optical resolution and mask alignment to be critical process aspects which tend to limit the extent to which device size can be decreased.

One of the devices that is particularly amenable to incorporation into VLSI circuits is the metal-oxide-semiconductor (MOS) field effect transistor (FET). High performance MOSFETs in particular often employ a symmetrical structure in which there is present a lightly doped source and drain region adjacent to the gate so as to reduce the effects of high field strengths in the gate region. These high field strengths are a direct consequence of the small distances between device structures. However, it is also desirable to form non-symmetrical high performance FETs on the same integrated circuit chip. The high performance FET is desirable because it has a low impedance source to offset parasitic series impedance effects caused by lightly doped source or drain regions adjacent to the gate. However, symmetrical devices are also desirable for pass gate circuit elements. Accordingly, in any method which attempts to further decrease circuit line widths, it is desirable to be able to construct both symmetrical and non-symmetrical FETs on the same circuit chip.

One of the limiting factors in the reduction of FET device size is the inherent width of the gate electrode. In conventional processing the gate electrode comprises a metal layer or a layer of doped polysilicon which is initially deposited over the whole substrate, wafer or chip. This material is then selectively etched using a "gate" mask pattern to provide the desired conductive pattern extending over the active area of an FET device with the source and drain region lying in the active area on either side of the gate electrode. Such devices are limited by the ability of processes to make the gate width small. Accordingly, it is desired to be able to shrink electronic circuit device sizes by providing a method for fabricating conductive patterns of very narrow widths, typically less than 0.5 microns. It is also desirable to be able to employ device fabrication processes which are not limited by optical or lithographic resolution. Moreover, it is desirable to be able to employ fabrication processes in which mask alignment is not critical. Lastly, but not limited hereto, it is desirable to be able to employ fabrication processes in which both symmetrical and non-symmetrical FET devices may be fabricated on the same chip without incurring the cost of increased process complexity and concomitant process yields. The problem of gate electrode definition is an important one in VLSI processing. If the gate is made too thin, problems of ion implantation masking effectiveness begin to evidence themselves and thus limit reduction in device size and deleteriously impact device characteristics. Thus, it is seen that it is desirable to have and to easily fabricate devices with a high gate height to width ratio, that is, with a high aspect ratio.

Another problem that exists in MOSFET devices is the inherent parasitic capacitance which exists as a result of large source and drain contact areas. Such capacitances limit device speed.

SUMMARY OF THE INVENTION

In accordance with the present invention a method for forming narrow conductive electrical circuit patterns comprises depositing, by chemical vapor deposition, a metal layer on the sidewall of a depository material. The depository material is disposed on an insulative substrate. The depository material also has a protective layer (for example, silicon nitride) disposed on top of it so as to make deposit of the conductive pattern selective to the sidewall of the depository material. With this method an edge defined electrical circuit conductive pattern is formed. The depository material, that is, conductive material, polysilicon or silicon nitride depending upon the specific embodiment of the present invention, is then generally removed, for example, by selective etching.

In accordance with another embodiment of the present invention, the edge defining method described above is employed to provide gate electrodes for MOSFET transistors. In this method, an active region is formed in a semiconductor material so that the active region is electrically isolated from the rest of the semiconductor material, typically by the formation of field oxide material. A particularly important feature of this embodiment is the formation of an insulative inlay well, typically formed in silicon oxide. An active area is provided at the bottom of the well, but does not occupy the entire "floor" area at the bottom of the well, or recess. A depository layer is then deposited, in the well and particularly over the active region after which a protective layer is deposited over the depository layer and a portion of the depository layer and the protective layer is removed so as to define a substantially vertical sidewall edge extending across at least a portion of the well and the active area, so as to divide the active area into source and drain regions. A conductive gate layer is then selectively deposited on the sidewall edge. The gate layer comprises material which is distinct from the depository layer and which is also selectively not deposited on the protective or insulative layer. The depository layer (conductive material, silicon nitride or the like) and the insulative or protective layer are then selectively removed whereby a thin gate electrode remains deposited over the gate insulation area in the active region. In particular, the gate electrode that is formed exhibits a height which is essentially determined by the depth of the well, or recess. Its width is a function of the process step time for selective deposition. Accordingly, it exhibits a readily controllable aspect ratio. It is desirable for the gate material to be high since this gate material, if too thin, is ineffective in the formation of source and drain regions during ion implantation steps. However, narrow gates are desirable for the purpose of reducing device size.

In an embodiment of the present invention employed for the fabrication of non-symmetric FET devices, selective doping of the semiconductor material through the gate insulation layer in the active region is performed prior to selective removal of the depository layer and the protective layer. The protective layer is referred to as such since it acts to prevent deposition of gate electrode material on the upper surface of the conductive material which is later removed. The depository layer is referred to as such since it comprises the material on which gate electrode material is deposited.

If the depository layer comprises metal or polysilicon, then the protective layer preferably comprises a material such as silicon nitride or silicon oxide disposed in a thin layer, especially if oxide is employed. If the depository layer comprises polysilicon, conductive patterns may be formed either by selective deposition, of tungsten for example, or by silicide formation.

In one embodiment of the present invention, silicon nitride is employed as a depository later for receiving gate material during non-selective deposition; in this instance, gate material is deposited and a reactive ion etch without a mask is used to form the gate on the sidewall of the silicon nitride layer. If nitride is employed as the depository layer in the manner described, then a protective layer is not needed. In this case also, a masking step is employed to remove gate material from sidewalls within an inlay opening, if desired to eliminate closed loop gate structures. It is the presence of this inlay opening which accounts for transistors fabricated in accordance with the present invention being referred to as "inlay transistors". However, in certain circumstances, this extra sidewall coating may be employed to advantage, in particular in the structure of inverters and in connection to adjacent MOS devices.

Accordingly, it is an object of the present invention to provide a method for forming narrow conductive electrical circuit patterns particularly in very large scale integrated (VLSI) circuits.

It is also an object of the present invention to provide a method for forming gate electrodes in MOSFET devices.

It is yet another object of the present invention to provide both symmetrical pass gate FETs and high performance, non-symmetrical FETs on the same circuit device.

It is a still further object of the present invention to provide transistor devices which are densely packed on an integrated circuit chip.

It is an additional object of the present invention to provide a high performance FET which has a low impedance source to offset parasitic series impedance effects caused by lightly doped source or drain regions next to the gate.

It is yet an additional object of the present invention to provide gate electrodes exhibiting a high aspect ratio.

It is also another object of the present invention to provide source and drain contacts which exhibit small parasitic capacitance.

It is a still further object of the present invention to solve the problem of closed circuit loop formation using edge-defined patterning.

It is still another object of the present invention to provide ladder-like circuit patterns for formation of logic circuit gates, such as NAND and NOR gates.

Lastly, but not limited hereto, it is an object of the present invention to provide a method for the fabrication of MOSFET transistors.

DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 1A-14A illustrate cross-sectional side elevation views of various sequential process steps involved in the fabrication of a non-symmetrical MOSFET inlay transistor in accordance with one embodiment of the present invention in which an edge defined gate electrode is employed;

FIGS. 1B-14B illustrate planar views of the structures shown in FIGS. 1A through 14B, respectively;

FIG. 16 is a planar view illustrating a masking option in which an interconnection pad is employed as a contact to the edge defined gate electrode;

FIGS. 18A-18I illustrate planar views of a masking process in which edge defined gate material is employed as a means for horizontally interconnecting adjacent transistor devices.

FIG. 19 illustrates a planar view showing a variation of the device embodiment shown in FIG. 18I in which redundant horizontal gate electrode interconnection is provided.

FIG. 20 illustrates a planar view of a "ladder" structure particularly useful in forming symmetrical MOSFET devices, especially NAND or NOR gates.

FIG. 21 is a planar view illustrating an alternate embodiment which provides vertical interconnection means for a plurality of transistor devices.

DETAILED DESCRIPTION OF THE INVENTION

The method disclosed herein is particularly useful for the formation of extremely narrow conductive electrical circuit patterns and VLSI circuit chips. Even more particularly, the present invention is useful in the formation of symmetrical and non-symmetrical MOSFET devices with gate widths typically less than 0.5 microns. The method disclosed for fabricating such devices is seen to be independent of the optical resolution of the lithographic machine utilized. FIGS. 1A-14A and 1B-14B illustrate a sequence of process steps employed in the fabrication of such devices. With particular reference to the present invention FIGS. 6A, 6B, 7A, 7B, 8A and 8B are most relevant.

In a method for fabricating finely structured MOSFET devices, active areas are formed using standard isoplanar methods with etch-back or are formed through the utilization of trench isolation techniques. The resulting structure is illustrated in FIGS. 1A and 1B. In particular, it is seen that each active area comprising silicon 100 is electrically isolated from the rest of the chip semiconductor substrate by field oxide portions 115. An oxide is deposited or formed and an inlay window is patterned in this oxide thus resulting in the presence of oxide step area 115' which lies at the bottom of a well or recess that provides the inlay structure of the present invention. This oxide substantially defines the gate height or thickness. It does not generally matter where the left and right edges of the inlay window lie, as long as the left and right edges lie outside of the active area. The resulting structure is shown in FIGS. 2A and 2B. The structure shown in these figures already illustrates the inlay aspect of the transistor of the present invention. Next, gate oxide layer 116 is formed on the exposed silicon. This layer forms the insulative gate oxide in the MOSFET device. See FIGS. 3A and 3B.

Figure 3A:
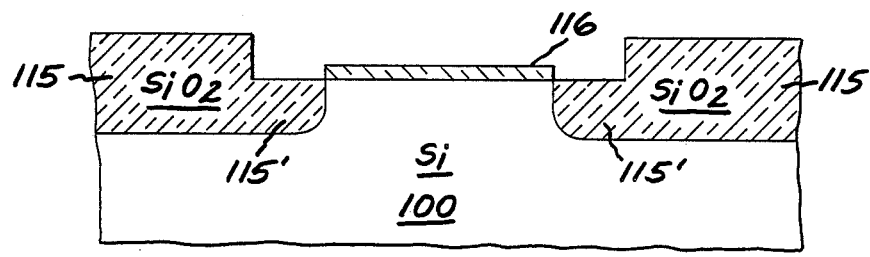
Figure 3B:
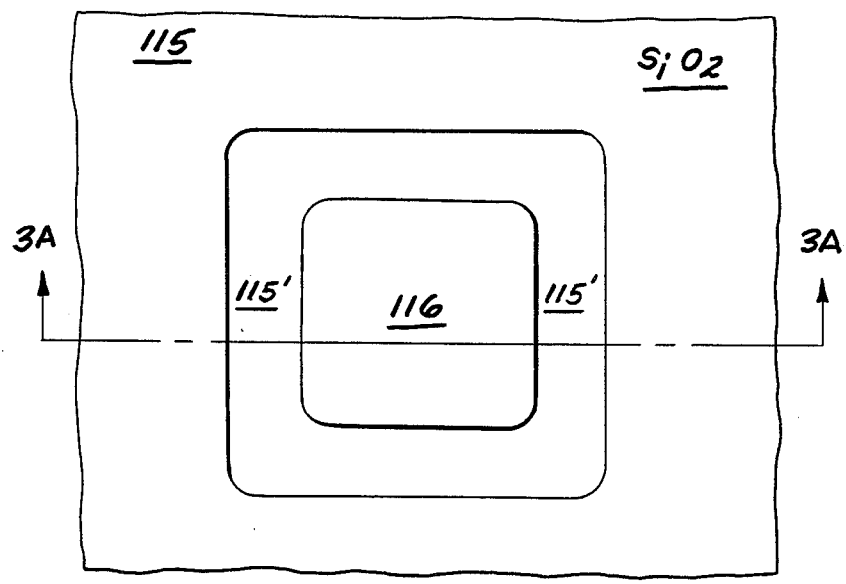
Figure 4A:
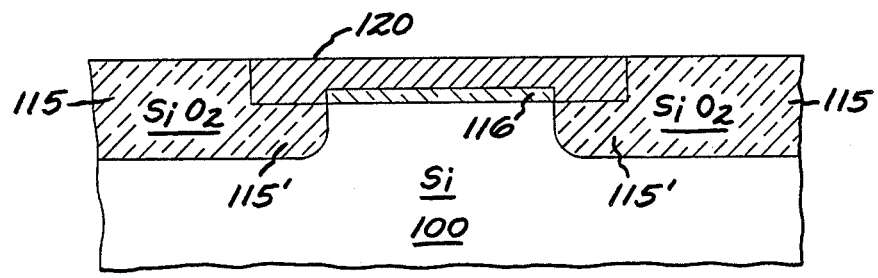
Figure 4B:
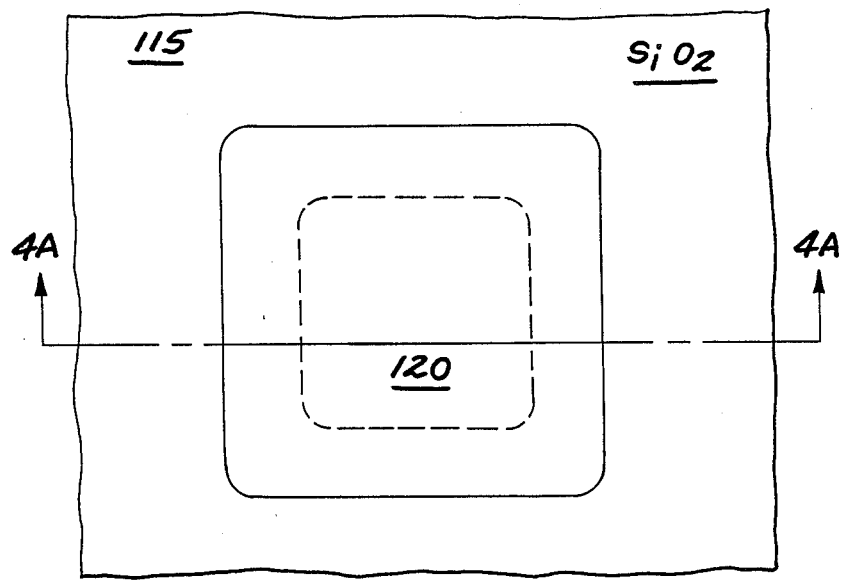
Figure 5A:
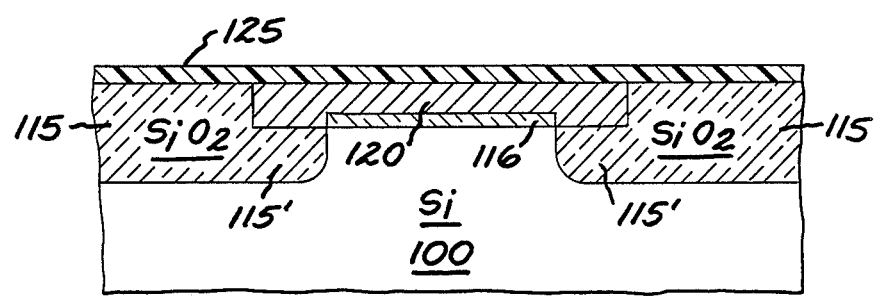
Figure 5B:
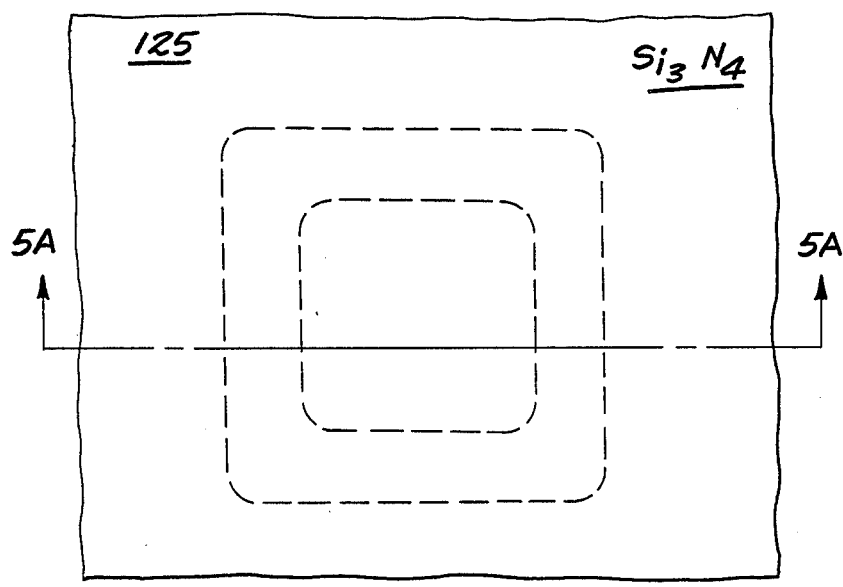

Next, in accordance with the present invention, depository material 120, different than oxide, is deposited on the substrate. This material is then planarized so that it is inlaid inside the oxide window, as shown in FIG. 4A. Depository material 120 may comprise polysilicon, metal, or even in one embodiment, silicon nitride, $Si_3N_4$. If the depository layer material is metal, the preferred metals comprise molybdenum and tungsten. If layer 120 comprises polysilicon or metal, this layer is then covered with a thin protective layer of nitride or oxide 125 (see FIGS. 5A and 5B). Next, an edge defining mask is used to selectively remove a portion of material 120 and overlying protective layer 125. The alignment of this mask is not critical since it is only required that the edge fall inside the active area. The opening in the mask for patterning layers 125 and 120 is discernable from FIG. 6B. The result of this masking and etching operation is shown in FIGS. 6A and 6B. It is noted that the method of the present invention is consistent with conventional VLSI circuit fabrication processes and generally employs conventional masking photoresist and etching materials.

The formation of a vertical edge across substantially all of the active area in the inlay region (see FIG. 6B) is important in the practice of the present invention. The vertical sidewall formed, directly between insulative and/or protective materials, such as silicon oxide 116 and silicon nitride 125, provides a surface for deposition of gate material 130 (see FIG. 7A). In the event that depository material 120 comprises metal, selective tungsten deposition is then preferably carried out to form gate electrode 130 (see FIGS. 7A and 7B). If material 120 comprises polysilicon, then it is preferable to form a silicide, such as tungsten or platinum silicide, on the exposed sidewall. It is also noted that tungsten is deposited selectively on metals other than molybdenum or on polysilicon. The length of gate 130 is determined by the length of the time of selective CVD tungsten deposition; if the gate is a silicide, the length is determined by the thickness of the silicide forming metal. If material 120 comprises silicon nitride no protective layer is needed and gate material 130 is preferably deposited and then reactive ion etched without a mask to form gate 130 on the exposed sidewall of material 120. In this latter case, another mask may be used to remove gate material along all or part of the three other sidewalls which typically comprise oxide and form part of the inlay opening. However, as discussed below, advantage may be taken of this resulting structure.

If gate oxide 116 is damaged or thinned during patterning of layer 120, then if material 120 is, for example, molybdenum, then gate oxide 116 can be re-formed using a mixture of steam and hydrogen which will grow $SiO_2$ on silicon, but not oxidize molybdenum.

Figure 8A:
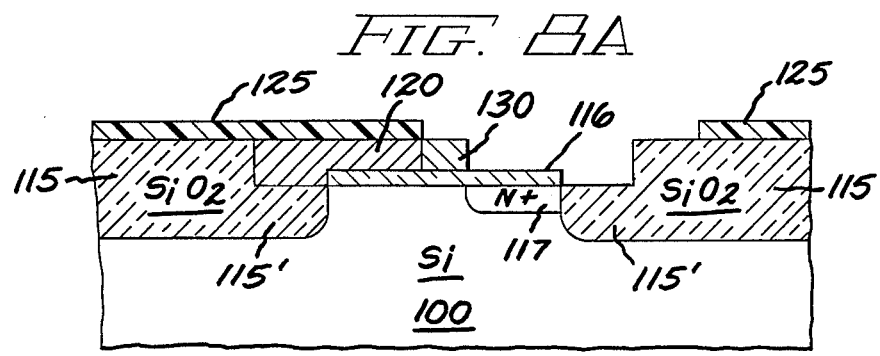
Figure 8B:
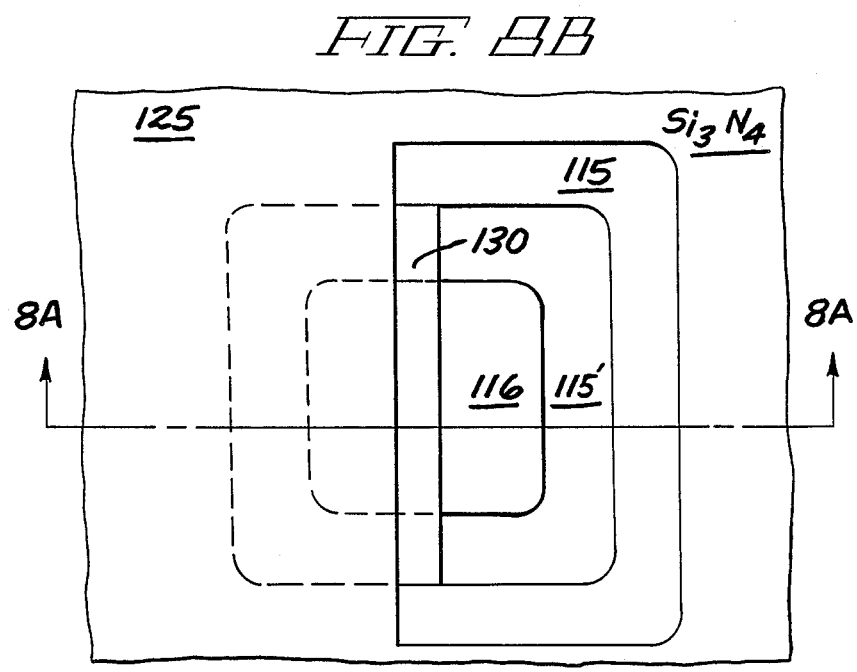

To make a non-symmetrical device, after the gate forming process is completed, the source region is ion implanted with a heavy dopant concentration. The resulting structure is shown in FIG. 8A. Material 120 acts as a mask in this implantation process. It is the presence of this mask, which partially extends over the active area of the transistor, which enables the formation of non-symmetrical transistor devices.

Figure 9A:
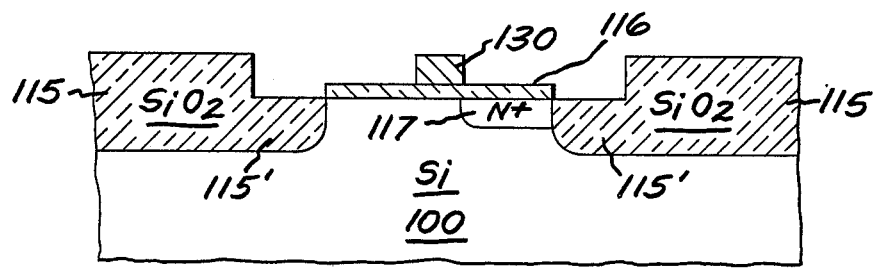
Figure 9B:
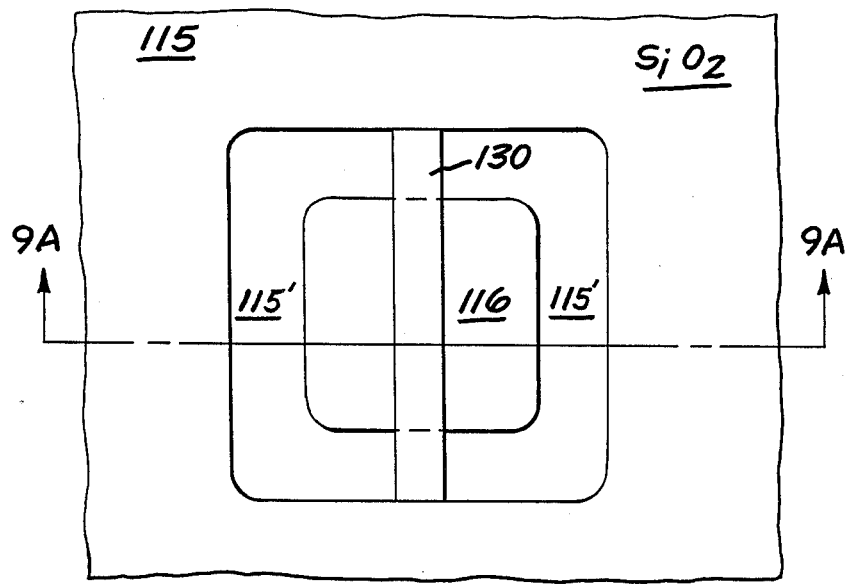
Figure 10A:
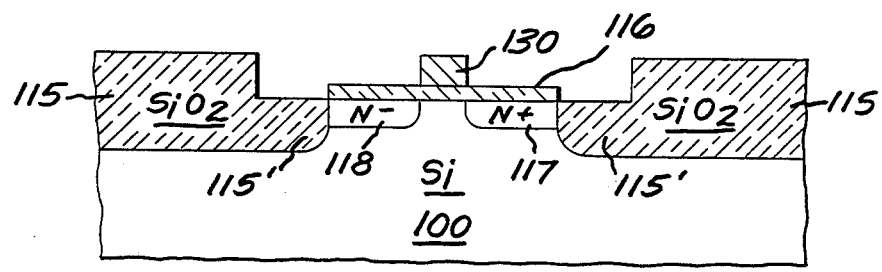
Figure 10B:
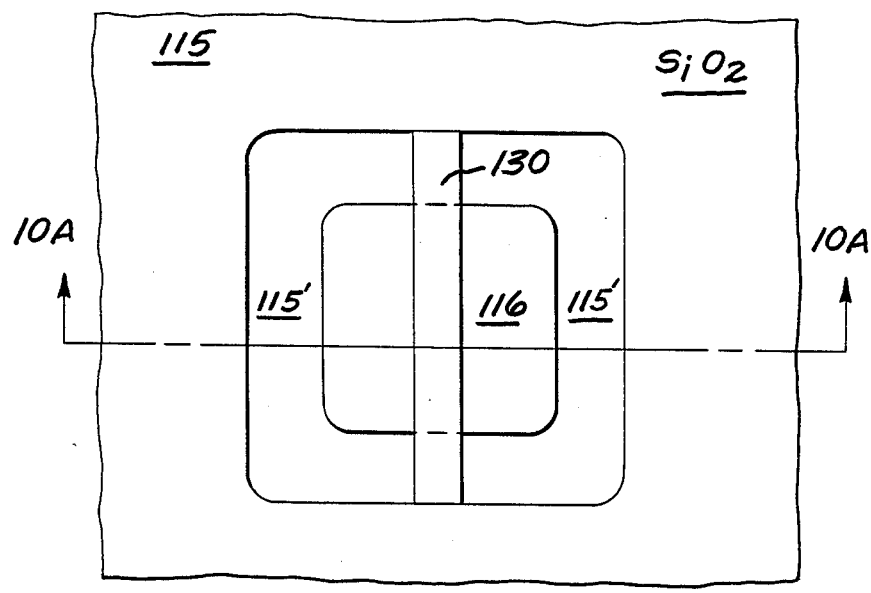
Figure 12A:
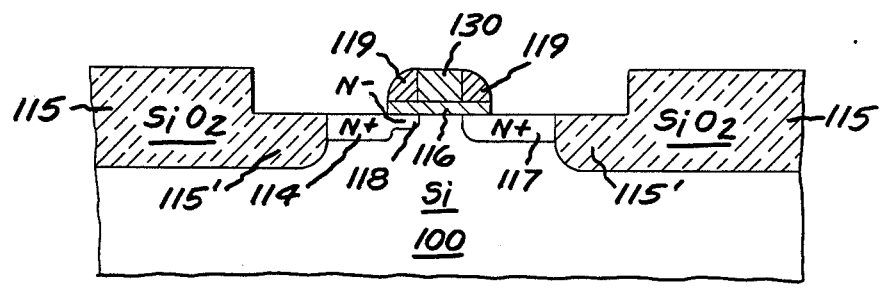
Figure 12B:
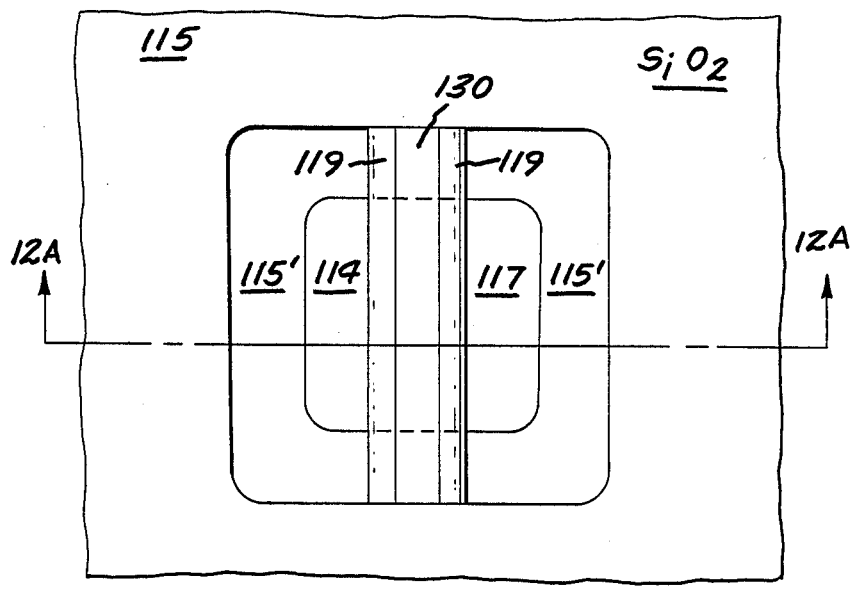

Next, layer 125 and material 120 are removed, at least from all of the inlay regions, for example, by etching. For instance, molybdenum can be selectively etched without etching tungsten. This is particularly advantageous in the present process if layer 120 comprises molybdenum, and tungsten is selectively deposited along the defined edge crossing the active area. A typical resulting structure is shown in FIGS. 9A and 9B. Next, without any mask, a second ion implantation step may be carried out for the $N^-$ lightly doped region 118. This complements previously formed heavily doped region 117. The result of this operation is illustrated in FIGS. 10A and 10B. It is noted that FIGS. 9B and 10B are essentially the same. Next, in accordance with prior MOSFET fabrication processes, sidewall spacer oxide is deposited and reactive ion etching is used to form sidewall spacers 119 on either side of gate 130. The resulting structure is shown in FIGS. 11A and 11B. Next, an $N^+$ ion implantation is performed to make contact regions for the source and drain. The result structure is shown in FIGS. 12A and 12B in which it is seen that $N^+$ doped region 114 has been formed. This process is then seen to be particularly directed to the formation of non-symmetrical high performance devices. It is also to be noted that symmetrical pass gate devices are also just as readily formed. Such devices are in fact formed by the processes which do not employ ion implantation before removal of inlay material 120. Symmetrical and non-symmetrical devices can be formed in the same wafer by masking only those devices that will become symmetrical during the ion implantation step required to form region 117. A typical resulting non-symmetrical structure is shown in FIGS. 12A and 12B. It is noted that FIGS. 11B and 12B are essentially the same.

Figure 13A:
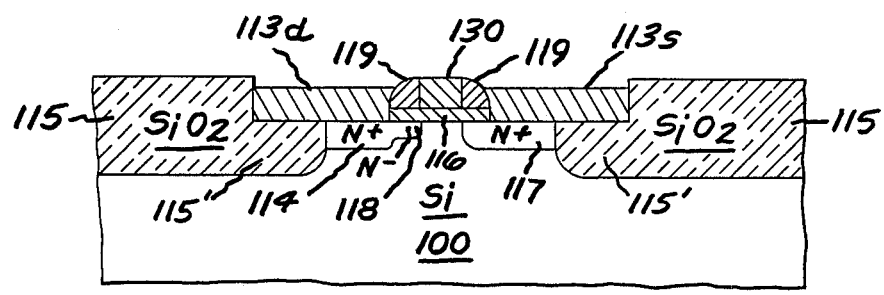
Figure 13B:
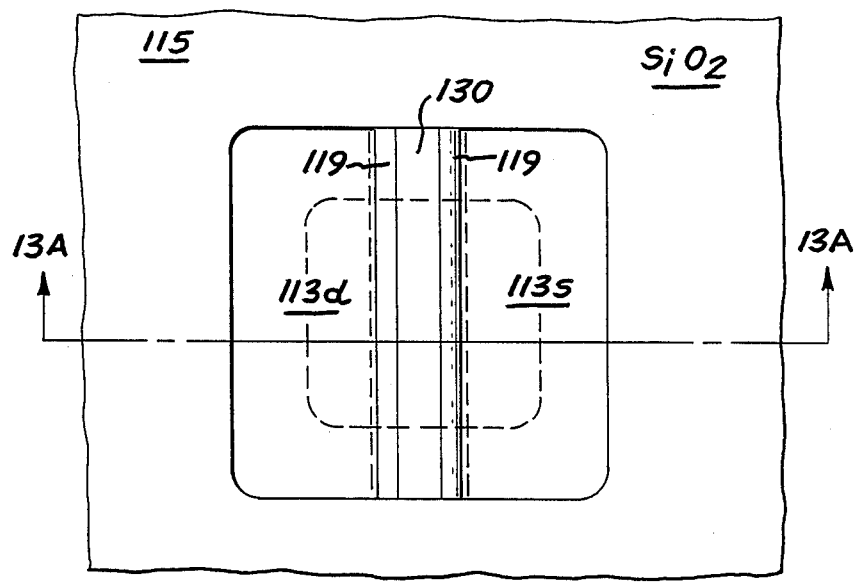

Next, contact metal 113s and 113d is deposited and planarized within the openings over the source and drain regions. Planarization etching removes metal over the field oxide regions so that the top surface of the remaining metal lies below the top surface of the oxide. The etching will etch the contact metal without etching the field oxide or gate material. For instance, molybdenum can be selectively etched without etching silicon oxide or tungsten. Gate sidewall oxide 119 is thus seen to provide insulation between these contacts and gate metal 130. The resulting structure is shown in FIGS. 13A and B. Alternately, this metal layer could be used to interconnect gates and drains of adjacent devices by using a mask to pattern the contact metal. It should also be noted from FIG. 13A that contacts 113s and 113d partially overlay oxide step 115' so that the entire lower contact metal surface does not overlie active regions 114 and 117, respectively. This structure reduces parasitic junction capacitance effects which are speed limiting in FET devices of this kind because the diodes can be made smaller than normal. This is another advantage provided by the inlay structure of the present invention.

Figure 14A:
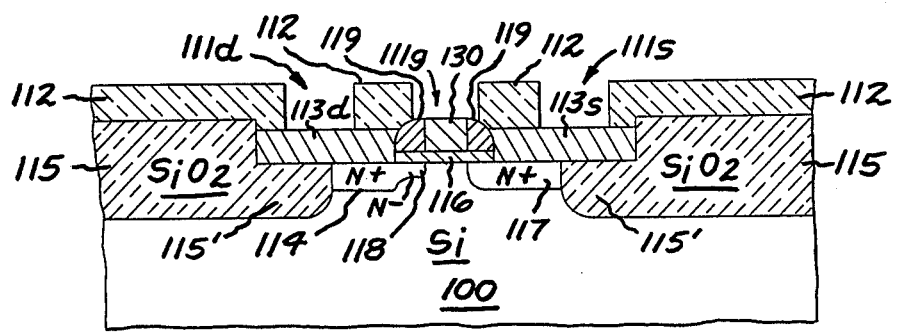
Figure 14B:
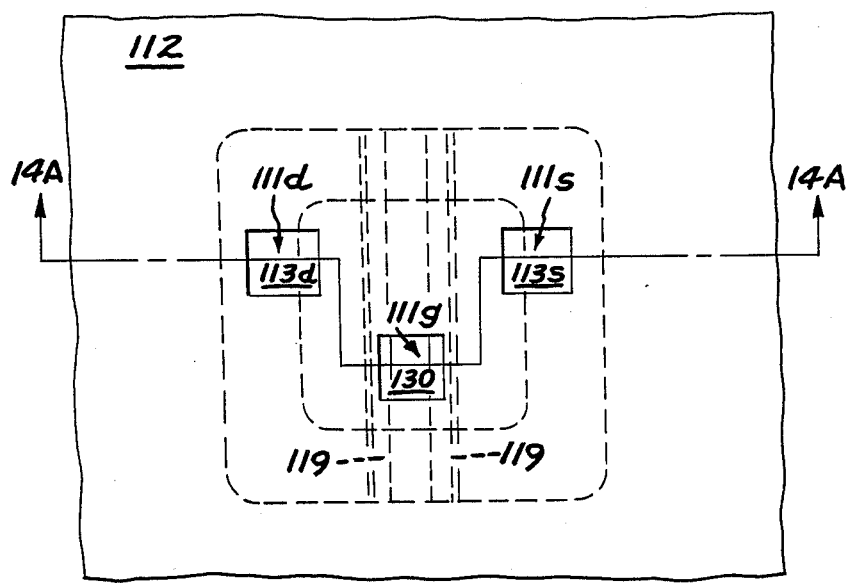
Figure 15:
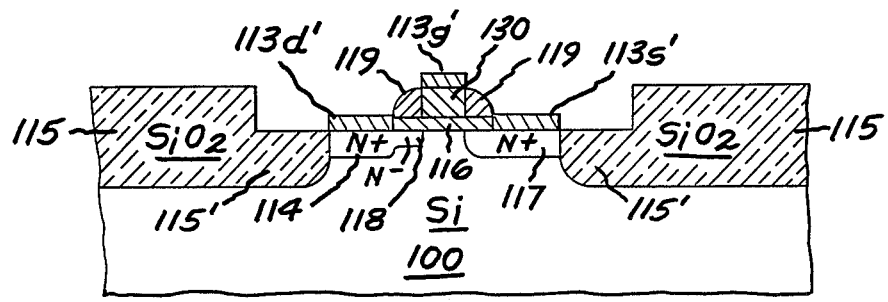
FIG. 15 illustrates a cross-sectional side elevation view of an embodiment of the present invention in which selective tungsten deposition is employed as the source and drain contact material.

Next, interlevel dielectric layer 112 is deposited and provided with these vias, as by etching. Vias 111s, 111g and 111d, as seen in FIGS. 14A and 14B are provided to permit contact between the transistor formed and a layer of interconnection metallization provided on top of dielectric layer 112. This latter metallization layer is conventional and not shown herein. In the event that the gate region needs to be further isolated from the source and drain contacts, selective tungsten deposition may be employed. The results of such a deposition process are particularly illustrated in FIG. 15 in which significantly thinner source gate and drain contacts 113s', 113g' and 113d', are provided.

Since the gate electrodes of the transistors fabricated in accordance with the present invention are so narrow, it is desirable to be able to provide a means for contacting these narrow structures. Such a method is illustrated in FIG. 16. In particular, a method for providing gate landing pad 131 is illustrated. If, for instance, material 120 comprises a metal such as tungsten or molybdenum, then one need only mask this material after gate electrode formation before removing it selectively. In this case, the inlay pattern is extended far enough over field oxide region 115' to allow for a gate landing pad region. The mask configuration is clear from FIG. 16. In this case, material 120 becomes an adjacent and integral part of the gate electrode. It should be noted with respect to FIG. 16 that pad 131, comprising depository material, is also patternable so as to extend further in a horizontal direction so that it extends from gate electrode 130 all the way to the wall of the inlay opening. Less critical masking is needed to pattern pad 131 in this way. However, it is noted that pad 131 should preferably not lie within the active area as indicated by the dotted line in FIG. 16.

Figure 17:
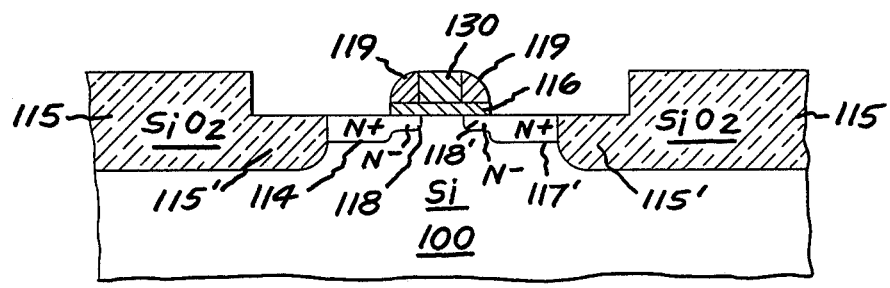
FIG. 17 is a cross-sectional side elevation view of an embodiment of the present invention more particularly illustrating a symmetrical MOSFET device.
Figure 18C:
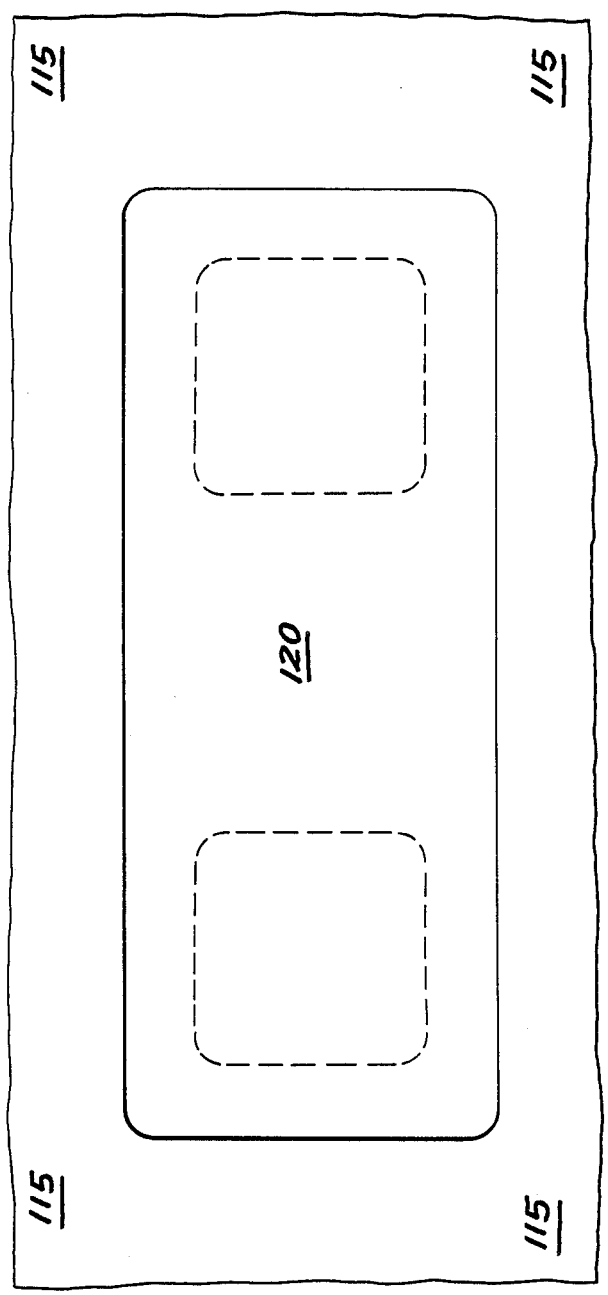
Figure 18I:
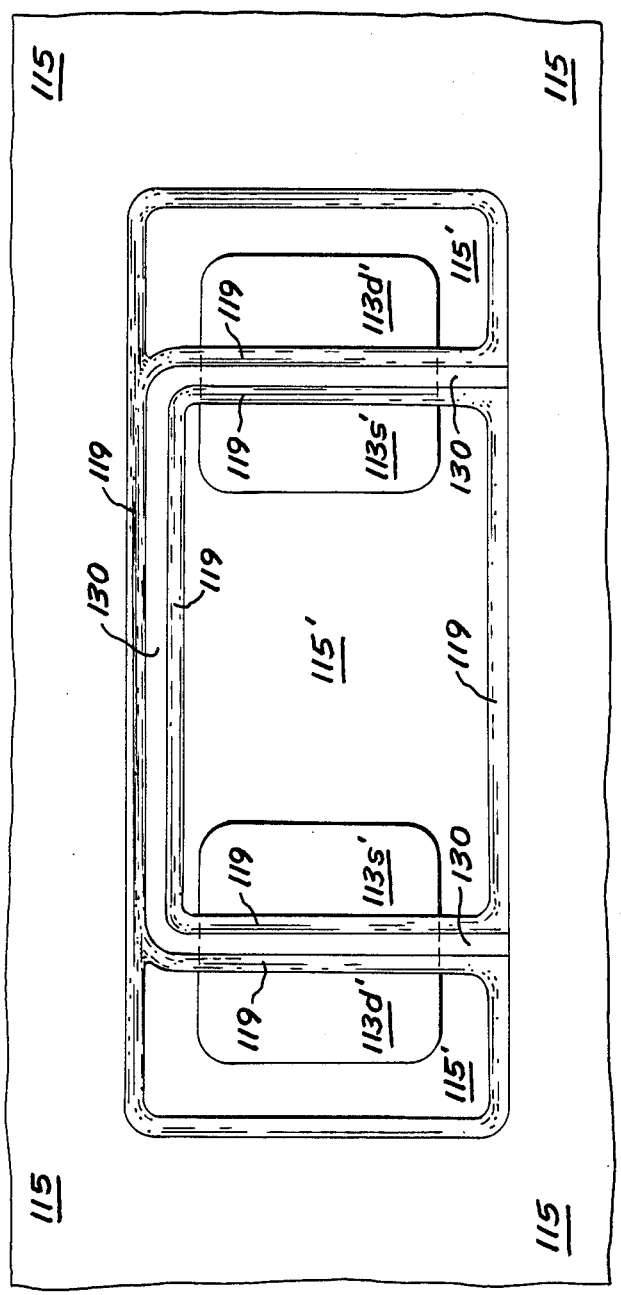

The process then continues substantially as described above with via holes being provided which are easily aligned with contacting material over the source and drain and with gate landing pad 131. The gate landing pad structure illustrated in FIG. 16, and discussed above, is also easily extended to multiple pass gate structures such as those found in NOR or NAND gates. In this case, material 120 is patterned so as to produce a ladder-like sequence of gate electrodes such as is shown in FIG. 20. Each gate electrode pair is preferably fabricated on opposite sides of depository material disposed within and patterned within the inlay opening. Each gate electrode is insulated with oxide spacer 119. The result is a structure with multiple symmetrical pass gate devices. For comparison, a single symmetrical structure is illustrated in FIG. 17.

In addition to the method for interconnecting adjacent transistor devices shown in FIGS. 18A–18I and FIG. 19, it is also possible to "vertically" connect the gate electrodes of adjacent transistor devices. Such an alternate configuration is shown in FIG. 21 in which single gate electrode 130 is seen to extend between the upper device and the lower device. A plurality of devices are joined in this manner. It is noted that these devices do not have to lie in a straight line.

If layer 120, in FIG. 4A, comprises silicon nitride, gate material is depositable without the use of a mask, by employing reactive ion etching to form gate 130 on the sidewall of depository layer 120. In this case, however, gate material is also deposited on the sidewalls of the oxide in the inlay opening. However, if it is desired to make a high density inverter, this aspect is used to advantage by using an inlay opening which extends over into a second, adjacent transistor active area region and both gates are connected together by the edge defining pattern formed at least partly by the inlay opening itself. A sequence of planar views in FIGS. 18A through 18I illustrate steps that are carried out in a process which produces similar results in that edge defined circuit patterns are used in the inlay opening to connect horizontally adjacent transistor devices. The process illustrated in FIGS. 18A–18I is substantially the same process as described above for the formation of individual transistor devices. The essential difference is the presence of an inlay opening linking two (or more) devices and the corresponding patterning of depository material. This patterning is most evident in the transition between FIGS. 18C and 18D. If redundancy in the device interconnection pattern is desired, depository material 120 may be patterned in loop, as shown in FIG. 19. However, alignment for this patterning is somewhat more critical. The loop in FIG. 19 is provided either by selective deposition on prior patterned depository material or by nonselective deposition on depository material followed by reactive ion etching; in the latter case gate material is deposited adjacent to the inlay edge along the long horizontal edge. It should also be noted that the process illustrated in FIGS. 18A through 18I is carried out using selective deposition methods for formation of gate electrode structures.

Apart from the gains with respect to parasitic capacitance accomplished by the present inlay transistor structure, other advantages should also be appreciated. The inlay structure also readily permits the fabrication of dual gate FET devices and in particular, a natural FET tetrode device is fabricatable. It is also noted that source and drain contacts naturally lie within the inlay opening so as to form a more planar structure. This helps to alleviate step coverage problems and promotes the defect free formation of multi-level devices and circuits. It is also noted that gate formation is accomplished with only single edge patterning. The double edge gate patterning of more conventional processing is thereby eliminated; this method and structure is therefore seen to mitigate alignment and registration concern. The contacts to the source and drain regions are also seen to be self-aligning and provide small area contacts with the small area diodes in the semiconductor material to reduce parasitic capacitance, yet provide sufficient contact area for good electrical connection to other circuit components.

From the above, it should be appreciated that the edge defined gate formation process of the present invention provides a means for fabrication of VLSI circuit devices which are of fine dimensions and closely spaced thereby saving expensive "chip real estate". It is also seen that the method of the present invention is generally applicable to the formation of narrow electrically conductive circuit patterns for high speed applications. It is seen that the method of the present invention provides a mechanism for fabrication of both symmetrical and non-symmetrical submicron gate self aligned inlay transistors on the same circuit chip. The methods described herein are also compatible with conventional VLSI fabrication techniques. It is therefore seen that the method and devices fabricated thereby provide significantly improved size and performance advantages over that which has otherwise been available without using difficult high resolution patterning.

While the invention has been described in detail herein, in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for forming narrow electrically conductive circuit patterns, said method comprising:
    disposing an electrically conductive material on the sidewall of a depository layer said depository layer being disposed on top of an insulative substrate and said depository layer also having a protective layer disposed on the top thereof so as to make the disposition of said conductive material selective to the sidewall of said depository layer.

2. The method of claim 1 in which said depository material comprises metal.

3. The method of claim 2 in which said protective layer comprises material selected from the group consisting of silicon oxide and silicon nitride.

4. The method of claim 2 in which said depository layer comprises material selected from the group consisting of tungsten and molybdenum and in which said electrically conductive material is distinct from the material of said depository layer.

5. The method of claim 2 in which said electrically conductive material is disposed by selective chemical vapor deposition.

6. The method of claim 1 in which said depository layer comprises polysilicon.

7. The method of claim 6 in which said protective layer comprises material selected from the group consisting of silicon oxide and silicon nitride.

8. The method of claim 6 in which said electrically conductive material is disposed on said sidewall by selective chemical vapor deposition.

9. The method of claim 8 in which said electrically conductive material is selected from the group consisting of tungsten and molybdenum.

10. The method of claim 1 in which said depository layer comprises material selected from the group consisting of tungsten and molybdenum.

11. The method of claim 1 in which said depository layer comprises silicon and said conductive material comprises material produced by silicide formation.

12. The method of claim 11 in which said silicides include palladium silicide, platinum silicide and tungsten silicide.

13. The method of claim 1 in which said depository layer comprises silicon nitride.

14. The method of claim 11 in which said disposing of said electrically conductive material on said sidewall comprises depositing said electrically conductive material and then reactively ion etching said electrically conductive material so as to form an edge defined gate pattern.

15. A method for forming narrow conductive electrical circuit patterns said method comprising, depositing by chemical vapor deposition, a metal pattern on the sidewall of a depository layer, said depository layer being disposed on top of at least one insulative area overlying a semiconductor material, said depository layer also having a protective layer disposed thereon so that said metal deposition is selective to said sidewall.

16. The method of claim 15 in which said depository layer comprises material selected from the group consisting of polysilicon, molybdenum and tungsten.

17. A method for forming a gate electrode in a transistor, said method comprising:
    forming an active region in a semiconductor material, said region being characterized in that it is substantially electrically isolated from the rest of said semiconductor material and disposed in a recess in insulative material which provides said electrical isolation;
    forming a layer of gate insulation material over said active area in said recess;
    disposing a depository layer over said gate insulation material;
    removing a portion of said depository layer so as to define a substantially vertical sidewall edge extending across at least a portion of said active area;
    forming a gate electrode layer on said sidewall edge, said gate layer comprising a material which is distinct from said depository layer; and
    selectively removing said depository layer, whereby a narrow gate electrode remains disposed over said gate insulation layer in said recess.

18. The method of claim 17 further including a step of depositing a protective layer over said depository layer and removing said protective layer in conjunction with the removal of said depository layer.

19. The method of claim 17 in which said protective layer comprises material selected from the group consisting of silicon nitride and silicon oxide.

20. The method of claim 17 further including selective doping of semiconductor material through exposed gate insulation in said active area prior to selective removal of said depository layer.

21. The method of claim 17 in which said depository layer comprises material selected from the group consisting of metals, polysilicon and silicon nitride.

22. A transistor comprising:
    an insulative layer having a recess with a substantially planar floor disposed therein;
    an active region disposed in said recess as part of said floor, said active area comprising suitably doped semiconductor material, said active region having an area smaller than the total floor area of said recess; and
    a gate electrode extending across at least a portion of said active region and being insulated therefrom;
    said active region further including spaced apart and suitably doped source and drain regions disposed on opposite sides of said gate electrode.

23. The transistor of claim 22 further including source and drain contacts in electrical contact with said source and drain regions of said semiconductor material.

24. The transistor of claim 22 in which the area of said active region is substantially less than the total floor area of said recess in said insulative layer.

25. The transistor of claim 22 in which said recess and said active region are substantially rectangular in shape.

26. The transistor of claim 22 in which said gate electrode extends entirely across the floor of said recess.

27. The transistor of claim 22 in which said insulative layer comprises silicon oxide.

28. The transistor of claim 22 in which said semiconductor material comprises silicon.

* * * * *